United States Patent
Tabei et al.

(10) Patent No.: US 10,294,346 B2
(45) Date of Patent: May 21, 2019

(54) ORGANIC MODIFIED SILICONE RESIN COMPOSITION

(71) Applicant: SHIN-ETSU CHEMICAL CO., LTD., Tokyo (JP)

(72) Inventors: Eiichi Tabei, Annaka (JP); Yoshifumi Harada, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 159 days.

(21) Appl. No.: 15/110,593

(22) PCT Filed: Nov. 25, 2014

(86) PCT No.: PCT/JP2014/005877
§ 371 (c)(1),
(2) Date: Jul. 8, 2016

(87) PCT Pub. No.: WO2015/114707
PCT Pub. Date: Aug. 6, 2015

(65) Prior Publication Data
US 2016/0326340 A1    Nov. 10, 2016

(30) Foreign Application Priority Data

Jan. 28, 2014   (JP) .................. 2014-012900

(51) Int. Cl.
| | |
|---|---|
| C08K 3/36 | (2006.01) |
| C08L 83/14 | (2006.01) |
| C08G 77/12 | (2006.01) |
| H01L 23/00 | (2006.01) |
| C08G 77/18 | (2006.01) |
| C08G 77/60 | (2006.01) |
| C08K 5/56 | (2006.01) |
| C08L 83/00 | (2006.01) |
| C08G 77/52 | (2006.01) |
| C08G 77/50 | (2006.01) |
| C08G 77/20 | (2006.01) |

(52) U.S. Cl.
CPC .............. *C08K 3/36* (2013.01); *C08G 77/12* (2013.01); *C08G 77/18* (2013.01); *C08G 77/60* (2013.01); *C08K 5/56* (2013.01); *C08L 83/00* (2013.01); *C08L 83/14* (2013.01); *H01L 24/83* (2013.01); *C08G 77/20* (2013.01); *C08G 77/50* (2013.01); *C08G 77/52* (2013.01); *H01L 2224/83862* (2013.01); *H01L 2924/0715* (2013.01); *H01L 2924/12041* (2013.01)

(58) Field of Classification Search
CPC ....................................... C08K 3/36
USPC ........................................ 524/862
See application file for complete search history.

(56) References Cited

U.S. PATENT DOCUMENTS

| | | | |
|---|---|---|---|
| 2006/0275617 A1 | 12/2006 | Miyoshi et al. | |
| 2008/0071023 A1* | 3/2008 | Tabei ............... | C08G 77/50 524/837 |
| 2008/0281056 A1* | 11/2008 | Tabei ............... | C08G 77/52 525/478 |
| 2008/0281117 A1* | 11/2008 | Tabei ............... | C07F 7/0896 556/466 |
| 2013/0345359 A1 | 12/2013 | Onai et al. | |

FOREIGN PATENT DOCUMENTS

| | | |
|---|---|---|
| CN | 102433004 A | 5/2012 |
| CN | 103509345 A | 1/2014 |
| JP | 2010-202831 A | 9/2010 |
| JP | 4648099 B2 | 3/2011 |
| JP | 2012-046604 A | 3/2012 |
| JP | 2012-140556 A | 7/2012 |
| JP | 2012-201754 A | 10/2012 |
| JP | 2012-219117 A | 11/2012 |
| JP | 2014-005334 A | 1/2014 |

(Continued)

OTHER PUBLICATIONS

Jan. 25, 2018 Office Action issued in Korean Patent Application No. 10-2016-7020698.
Translation of Jan. 13, 2015 Search Report issued in International Patent Application No. PCT/JP2014/005877.
May 17, 2016 Office Action issued in Japanese Patent Application No. 2014-012900.
Aug. 2, 2016 International Preliminary Report on Patentability issued in International Patent Application No. PCT/JP2014/005877.
Jul. 26, 2016 Office Action issued in Japanese Patent Application No. 2014-012900.

(Continued)

*Primary Examiner* — Jane L Stanley
(74) *Attorney, Agent, or Firm* — Oliff PLC

(57) ABSTRACT

An organic modified silicone resin composition includes: (A) an addition reaction product having two addition reactive carbon-carbon double bonds in one molecule, being a product of an addition reaction of (a) a compound shown by the general formula (1) having SiH groups and (b) a polycyclic hydrocarbon having addition reactive carbon-carbon double bonds; (B) a siloxane having an SiH group and an organic group substituted with an alkoxysilyl group and/or a siloxane having an SiH group and an organic group substituted with an epoxy group; (C) a compound having three or more SiH groups in one molecule; (D) a catalyst; and (E) fumed inorganic oxide. The formulation amount of the component (E) is 1 to 10 parts by mass relative to 100 parts by mass of the total amount of the components (A), (B), and (C); and having a viscosity of 10 to 100 Pa·s at 25° C.

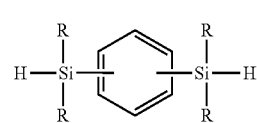

(1)

11 Claims, No Drawings

(56) References Cited

FOREIGN PATENT DOCUMENTS

| KR | 20120020069 A | 3/2012 |
|----|---------------|--------|
| KR | 20140000171 A | 1/2014 |

OTHER PUBLICATIONS

Jul. 12, 2017 Office Action issued in Korean Patent Application No. 10-2016-7020698.
Jun. 27, 2018 Office Action issued in Chinese Patent Application No. 201480074323.3.

* cited by examiner

ORGANIC MODIFIED SILICONE RESIN COMPOSITION

TECHNICAL FIELD

The present invention relates to an organic modified silicone resin composition, which is useful for die bonding of a light emitting diode (LED) device and so on.

BACKGROUND ART

Previously, epoxy resins have been used for sealing material and die bonding material (that is, adhesives to adhere dies such as LED devices and a base material such as a package) of LED devices. When the resin is too soft, particularly in die bonding material, there arises a problem of failing to bond in a wire bonding step performed after the die bonding step. Accordingly, epoxy resins, which are adhesive with high hardness, have been previously used for the die bonding material. The sealing material and die bonding material composed of epoxy resin is sometimes yellowed by strong ultraviolet and are liable to absorb light. Accordingly, they have a problem of durability such as lowering brightness of LED when used for blue LED or white LED.

Recently, demands for durability of LED has been increased, and epoxy resin has been substituted by silicones resin, which has excellent durability, for sealing materials of LED devices. As same as the sealing material, the die bonding material is required to have durability, and die bonding compositions composed of silicone resin material has been proposed (Patent Document 1). These compositions, however, do not always give cured products through heat curing to fulfill the sufficient hardness, and sometimes fail to perform constant bonding.

CITATION LIST

Patent Literature

Patent Document 1: Japanese. Patent No, 4648099

SUMMARY OF INVENTION

Technical Problem

The present invention was accomplished in view of the above-described problems. It is an object of the present invention to provide an organic modified silicone resin composition with good transfer performance and workability, giving a cured product with high hardness, excellent heat discoloration resistance and adhesion property.

Solution to Problem

To solve the foregoing problems, the present invention provides an organic modified silicone resin composition comprising:

(A) an addition reaction product having two addition reactive carbon-carbon doable bonds in one molecule, being a product of an addition reaction of (a) a compound shown by the following general formula (1), having two silicon atom-bonded hydrogen atoms in one molecule,

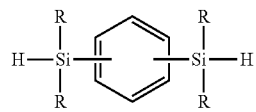

(1)

wherein "R" independently represents an alkoxy group having 1 to 6 carbon atoms or a monovalent hydrocarbon group having 1 to 12 carbon atoms being unsubstituted or substituted with any of a halogen atom, a cyano group, or a glycidoxy group, and (b) a polycyclic hydrocarbon having two addition reactive, carbon-carbon double bonds in one molecule;

(B) a siloxane having a silicon atom-bonded hydrogen atom and an organic group substituted with an alkoxysilyl group, a siloxane having a silicon atom-bonded hydrogen atom and an organic group substituted with an epoxy group, or a combination thereof;

(C) a compound having three or more silicon atom-bonded hydrogen atoms in one molecule other than the component (B);

(D) a hydrosilylation reaction catalyst; and (E) fumed inorganic oxide; wherein, the formulation amount of the component. (E) is 1 to 10 parts by mass relative to 100 parts by mass of the total amount of the components (A), (B), and (C); and having a viscosity of 10 to 100 Pa·s at 21° C.

Such an organic modified silicone resin composition can be an organic modified silicone resin composition with good transfer performance and workability, giving a cured product with high hardness, excellent heat discoloration resistance and adhesion. property.

The (b) polycyclic hydrocarbon is preferably either or both of 5-vinylbicyclo[2.2.1]hept-2-ene and 6-vinylbicyclo [2.2.1]hept-2-ene.

Such a component (b) can give a cured product with high hardness, excellent crack resistance and heat discoloration resistance in particular.

The component (C) is preferably a compound having a cyclic siloxane structure, particularly preferably an addition reaction product of 1,3,5,7-tetramethyl-cyclotetrasiloxane and either or both of 5-vinylbicyclo-[2.2.1]hept-2-ene and 6-vinylbicyclo[2.2.1]hept-2-ene.

Such a component (C) can give a cured product, with higher hardness, more excellent crack resistance and heat discoloration resistance.

The component (E) is preferably fumed silica.

The fumed silica can be easily procured.

It is preferable that the Shore D hardness of a cured product of the organic modified silicone resin composition be 60 or more.

With such hardness, the inventive composition is more suitable for die bonding material.

Advantageous Effects of Invention

As described above, the inventive organic modified silicone resin composition can be an organic modified silicone resin composition with good transfer performance and workability, giving a cured product with high hardness, excellent heat discoloration resistance, adhesion property, and crack resistance. Such an inventive organic modified silicone resin composition is particularly useful as die bonding material used for die bonding of LED devices and so on.

DESCRIPTION OF EMBODIMENTS

As described above, it has been desired to develop an organic modified silicone resin composition with good transfer performance and workability, giving a cured product with high hardness, excellent heat discoloration resistance and adhesion property.

The present inventors diligently study to accomplish the foregoing problems and consequently found that the inventive organic modified silicone resin composition formulated a particular amount of fumed inorganic oxide can achieve the foregoing problem, thereby brought the present invention to completion.

That is, the present invention is an organic modified silicone resin composition comprising:

(A) an addition reaction product having two addition reactive carbon-carbon double bonds in one molecule, being a product of an addition reaction of (a) a compound shown by the following general formula (1), having two silicon atom-bonded hydrogen atoms in one molecule,

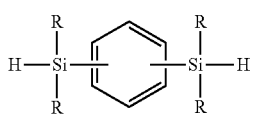
(1)

wherein "B" independently represents an alkoxy group having 1 to 6 carbon atoms or a monovalent hydrocarbon group having 1 to 12 carbon atoms being unsubstituted or substituted with any of a halogen atom, a cyano group, or a glycidoxy group, and (b) a polycyclic hydrocarbon having two addition reactive carbon-carbon double bonds in one molecule;

(B) a siloxane having a silicon atom-bonded hydrogen atom and an organic group substituted with an alkoxysilyl group, a siloxane having a silicon atom-bonded hydrogen atom and an organic group substituted with an epoxy group, or a combination thereof;

(C) a compound having three or more silicon atom-bonded hydrogen atoms in one molecule other than the component (B);

(D) a hydrosilylation reaction catalyst; and (E) fumed inorganic oxide; wherein the formulation amount of the component (E) is 1 to 10 parts by mass relative to 100 parts by mass of the total amount of the components (A), (B), and (C); and having a viscosity of 10 to 100 Pa·s at 25° C.

Hereinafter, the present invention will be described in detail, but the present invention is not limited thereto.

It is to be noted that in this specification, the wording "addition reactive" means a property which can react with a silicon atom-bonded hydrogen atom through a hydrosilylation reaction, which is well-known addition reaction.

In this specification, "Me" represents a methyl group, and "Ph" represents a phenyl group.

[Component (A) ]

The component (A) of the inventive organic modified silicone resin composition is an addition reaction product having two addition reactive carbon-carbon double bonds in one molecule, being a product of an addition reaction of (a) a compound shown by the foregoing general formula (1), having two silicon atom-bonded hydrogen atoms (hereinafter also referred to as SiH groups) in one molecule, and (b) a polycyclic hydrocarbon having two addition reactive carbon-carbon double bonds in one molecule.

<Component (a)>

This component (a), which is a reaction raw material of the component (A), is a compound shown by the following general formula (1), having two silicon atom-bonded hydrogen atoms in one molecule,

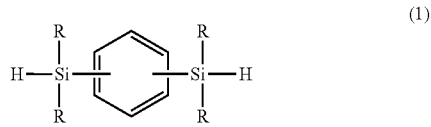
(1)

wherein "R" independently represents an alkoxy group having 1 to 6 carbon atoms or a monovalent hydrocarbon group having 1 to 12 carbon atoms being unsubstituted or substituted with any of a halogen atom, a cyano group, or a alycidoxy group.

As the "R" in the general formula (1), a group other than alkenyl groups and a group other than alkenylaryl groups are preferable, and a methyl group is particularly preferable.

In the component (a), it is particularly preferable that every "R" in the general formula (1) is a methyl group. Illustrative examples thereof include a silphenylene compound such as:

1,4-bis(dimethylsilyl)benzene shown by a structural formula: $HMe_2Si$-p-$C_6H_4$-$SiMe_2H$, 1,3-bis(dimethylsilyl)benzene shown by a structural formula: $HMe_2Si$-m-$C_6H_4$-$SiMe_2H$.

The component (a) may be used alone or in combination of two or more kinds.

<Component (b)>

The component (b), which is another reaction raw material of the component (A), is a polycyclic hydrocarbon having two addition reactive carbon-carbon double bonds in one molecule. This forms the component (A) by an addition reaction of addition reactive carbon-carbon double bonds in the component (b) with the foregoing SiH groups in the component (a) through a hydrosilylation reaction.

It is to be noted that the component (b) can be any one of (i) a polycyclic hydrocarbon in which each addition reactive carbon-carbon double bond is formed between the adjacent two carbon atoms forming the skeleton of the polycyclic hydrocarbon, (ii) a polycyclic hydrocarbon in which a hydrogen atom bound to a carbon atom forming the skeleton of the polycyclic hydrocarbon is substituted with a group (s) having an addition reactive carbon-carbon double bond(s), and (iii) a polycyclic hydrocarbon in which an addition. reactive carbon-carbon double bond is formed between the adjacent two carbon atoms forming the skeleton of the polycyclic hydrocarbon and a hydrogen atom bound to a carbon atom forming the skeleton of the polycyclic hydrocarbon is substituted with a group having an addition reactive carbon-carbon double bond.

The component (b) is preferably 5-vinylbicyclo[2.2.1] hept-2-ene shown by the following structural formula (x), 6-vinylbicyclo[2.2.1]hept-2-ene shown by the following structural formula (y), or a combination thereof (hereinafter these three are generally referred to as "vinylnorbornene" when they do not have to be distinguished).

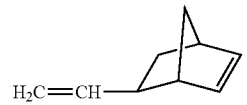
(x)

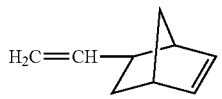

It is to he rioted that the position substituted with a vinyl group in the vinylnorbornene can be either cis configuration (exo form) or trans configuration (endo form). Moreover, it may be a combination of both isomers of the foregoing configurations, since the difference of the configuration does not bring particular difference of the reactivity of the component (b) and so on.

<Examples of Component (A)>

Preferable examples of the component (A) are shown by the following general formula (2), but the component (A) is not limited thereto:

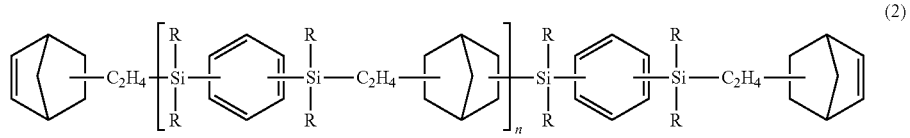

wherein "R" has the same meaning as defined above, and "n" is an integer of 0 to 50, preferably 0 to 30, more preferably 0 to 20.

A cured product obtained from this compound particularly has high hardness, excellent crack resistance and heat discoloration resistance (transparency, heat resistance), since this compound contains polycyclic hydrocarbon group(s) and a phenylene group(s).

<Preparation of Component (A)>

The component (A) can he obtained as an addition reaction product which does not have an SiH group by an addition reaction of 1 mol of the component (a) having two SiH groups in one molecule with the component (b) having two addition reactive carbon-carbon double bonds in one molecule in an excessive amount of more than 1 mol and 10 mol or less, preferably more than 1 mol and 5 mol or less under a hydrosilylation reaction catalyst.

As the hydrosilylation reaction catalyst, previously known ones can be used.

Illustrative examples thereof include platinum-based catalysts such as metal platinum-supporting carbon. powder, platinum black, platinum chloride, platinic chloride, reaction products of platinic chloride and monovalent alcohol, complexes of platinic chloride and olefin, platinum bis(acetoacetate); platinum group metal-based catalysts such as palladium-based catalysts and rhodium-based catalysts. The conditions of the addition reaction, use of a solvent(s), and so on are not particularly limited, and can be conventionally performed.

As described above, in preparing the component (A), the component (b) is used in an excess molar ratio to the component (a). Accordingly, the component (A) has two addition reactive carbon-carbon double bonds, which are derived from a structure of the component (b), in one molecule.

The component may be used alone or in combination of two or more kinds.

[Component (B)]

The component (B) of the Inventive organic modified silicone resin composition is a compound having a SiH group(s) and an organic group(s) substituted with an alkoxysilyl group(s), a compound having a SiH group(s) and an organic group(s) substituted with an epoxy group(s) or a combination thereof. The SiH groups in the component (B) add to addition reactive carbon-carbon double bonds in the component (A) by a hydrosilylation reaction to give a cured product with a three-dimensional network structure and gives the composition adhesion property to adhere with substrate material.

Illustrative examples of the component (B) include 1-(2-trimethoxysilylethyl)-1,3,5,7-tetramethylcyclotetrasiloxane, 1-(3-glycidoxypropyl)-1,3,5,7-tetramethylcyciotetrasiloxane, 1-(2-trimethoxysilylethyl)-3-(3-glycidoxypropyl)-1,3,5,7-tetramethylcyclotetrasiloxane, etc. These may be used alone or in combination of two or more kinds.

[Component (C)]

The component (C) of the inventive organic modified silicone resin composition is a compound having three or more SiH groups in one molecule other than the foregoing component (B). The SiH groups in the component (C) add to addition reactive carbon-carbon double bonds in the component by a hydrosilylation reaction to give a cured product with a three-dimensional network structure.

The component (C) preferably has a cyclic siloxane structure(s). Illustrative examples of such a component (C) include cyclic siloxane-based compounds shown by the following general formula (3):

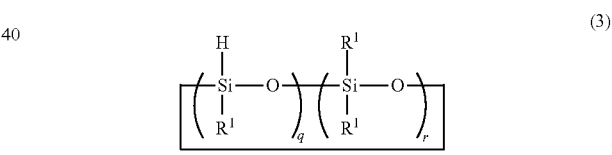

wherein, $R^1$ independently represents a hydrogen atom or an unsubstituted or substituted monovalent hydrocarbon group having 1 to 12, preferably 1 to 6 carbon atoms other than an alkenyl group; "q" is an integer of 3 to 10, preferably 3 to 8; "r" is an integer of 0 to 7, preferably 0 to 2; and the sum of q+r is an integer of 3 to 10, preferably 3 to 6.

Illustrative examples of $R^1$ in the general formula (3) in which $R^1$ is an unsubstituted or substituted monovalent hydrocarbon group other than an alkenyl group include alkyl groups such as a methyl group, an ethyl group, a propyl group, an isopropyl group, a butyl group, a tert-butyl group, a pentyl group, an isopentyl group, a hexyl group, and a sec-hexyl group; cycloalkyl groups such as a cyclopentyl group and a cyclohexyl group; aryl groups such as a phenyl group and an o-, m-, p-tolyl groups; aralkyl groups such as a benzyl group and a 2-phenylethyl group; alkenylaryl groups such as a p-vinylphenyl group; and groups in which at least one carbon atom-bonded hydrogen atom of these groups is substituted by a halogen atom(s), a cyano group(s), an epoxy ring-containing group(s), and so on, for example, halogenated alkyl groups such as a chloromethyl group, a 3-chloropropyl group, and a 3,3,3-trifluoropropyl group; a 2-cyanoethyl group; and a 3-glycidoxy propyl group.

Among these, a methyl group and a phenyl group are particularly preferable as the $R^1$. The cyclic siloxane-based compounds shown by the general formula (3) in which all of the $R_1$ are methyl groups or phenyl groups are preferable since they can be easily produced industrially and is easily available.

The component (C) is preferably an addition reaction product having three or more SiH groups in one molecule, for example, obtained by a hydrosilylation reaction of a vinylnorbornene(s) illustrated in the foregoing component (b) and 1,3,5,7-tetramethyl-cyclotetrasiloxane. Such a component. (C) can give a cured product with higher hardness, more excellent crack resistance and heat discoloration resistance.

Illustrative examples of such a component (C) include compounds shown by the following general formula:

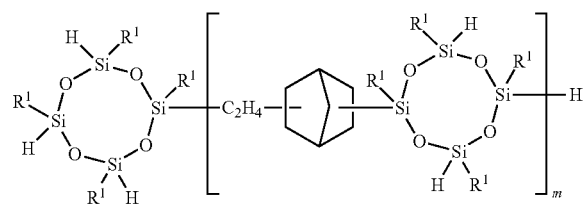

wherein $R^1$ has the same meaning as defined above, and "m" is an integer of 1 to 100, preferably 1 to 10, Preferable examples of the component (C) are shown below, but the component (c) is not limited thereto:

(HMe SiO)$_3$
(HMe SiO)$_4$
(HMe SiO)$_3$ (Me$_2$SiO)
(HMe SiO)$_4$ (Me$_2$SiO)
Me$_3$SiO (MeH SiO)$_3$(Ph$_2$SiO)$_2$SiMe$_3$
Me$_3$SiO (MeH SiO)$_4$(P h$_2$SiO)$_2$SiMe$_3$
HMe$_2$SiO (MeH SiO) (Ph$_2$SiO)$_2$SiMe$_2$H
HMe$_2$SiO (MeH SiO)$_2$ (Ph$_2$SiO)$_2$SiMe$_2$H

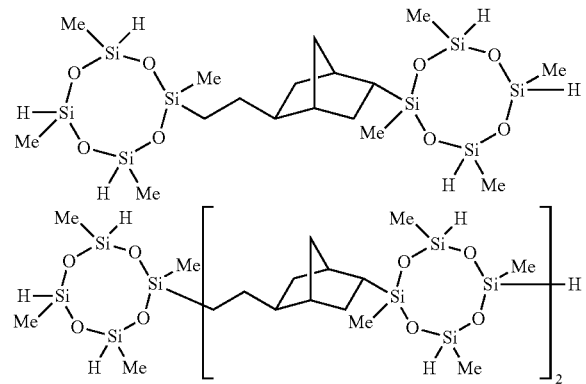

The component (C) may be used alone or in combination of two or more kinds.

[Formulation Amount of Components (A), (B), and (C)]

The formulation amounts of components (A), (B) and (C) are favorably an amount such that the total amount of SiH groups in each component is generally 0.5 to 3.0 mol, preferably 0.8 to 1.5 mol relative to a total of 1 mol of addition reactive carbon-carbon double bonds in each component. Such formulation amounts enables to give a cured product having a sufficient hardness for die bonding material.

It is to be noted that when formulating a silicon-based compound having a SiH group or a silicon-based compound having an addition reactive carbon-carbon double bond other than the components (A), (B), and (C), or a combination thereof as an optional component described below, it is preferable that the total amount of SiH groups in the composition be generally in a range of 0.5 to 3.0 mol, preferably 0.8 to 1.5 mol relative to a total of 1 mol of addition reactive carbon-carbon double bonds in the composition as in the foregoing.

[Component (D)]

The hydrosilylation reaction catalyst, which is the component (D) of the inventive organic modified silicone resin composition, is the same as described in the foregoing "Preparation of component (A)."

The formulation amount of the component (D) can be an effective amount as a catalyst, and is not particularly limited. However, it is preferable to formulate in such a way that the amount is approximately 1 to 500 ppm generally, particular 2 to 100 ppm in terms of mass of the platinum group metal atom relative to the total mass of components (A), (B), and (C). Such formulation amount realizes a proper curing time required for the curing reaction and does not cause problems such as coloring of a cured product.

[Component (E)]

The fumed inorganic oxide, which is the component (E) of the inventive organic modified silicone resin composition, is not particularly limited. However, it is favorable to have a specific surface area of 50 m$^2$/g or more in general, preferably 80 m$^2$/g or more, more preferably 100 m$^2$/g or more, and generally 300 m$^2$/g or less, preferably 250 m$^2$/g or less. Being such a specific surface area, the fumed inorganic oxide brings sufficient addition effect and is easily dispersed into the resin.

As the component (E), fine particle is particularly preferable. The silica fine particle to be used can have a hydrophobic surface, for example, by reacting a surface modifier with silanol groups on the surface of a hydrophilic silica fine particle. Illustrative examples of the surface modifier include alkylsilane compounds such as dimethyldichlorosilane, hexamethyldisilazane, octylsilane, dimethylsilicone oil, etc.

As a favorable example of the silica fine particle, for example, fumed silica can be mentioned since it is easy to procure. Fumed silica is prepared by oxidizing and hydrolyzing SiCl$_4$ gas with flame of 1,100 to 1,400° C. combusting mixed gas of H$_2$ and O$_2$. The primary particle of fumed silica is a spherical ultrafine particle mainly composed of amorphous silicon dioxide (SiO$_2$) with an average particle size of about 5 to 50 nm. This primary particles aggregate each other to form a secondary particle with a particle size of several hundred nm. Fumed silica is an ultrafine particle, and has a surface with a chemically active structure since it is produced by quenching.

Illustrative examples thereof include "AEROSIL" (registered trade mark) produced by NIPPON AEROSIL CO., LTD. such as AEROSIL (registered trade mark) hydrophilic fumed silica including "90", "130", "150", "200", and "300"; and AEROSIL (registered trade mark) hydrophobic fumed silica including "R8200", "R972", "R972V", "R972CF", "R974", "R202", "R805", "R812", "R812S", "RY200", "RY200S", and "RX200". Also, "REOLOSIL" produced by Tokuyama Corporation such as "DM-10", "DM-20", and "DM-30" may be mentioned.

The formulation amount of the component (E) is 1 to 10 parts by mass, preferably 2 to 8 parts by mass relative to 100 parts by mass of the total amount of the component (A), (B), and (C).

When the amount is less than 1 parts by mass, the component (E) does not exhibits the addition effect, and the composition spreads out in the transfer when used as die bonding material, thereby lowering the adhesion. On the other hand, when the amount is more than 10 parts by mass, the composition raises its viscosity, thereby lowering the workability, causing legginess in stamping when used as die bonding material.

Formulation of the component (E) in a proper amount gives a composition with a proper viscosity having a thixotropic property, and accordingly the transfer performance is improved when used as die bonding material.

[Other Formulation Components]

The inventive organic modified silicone resin composition can be formulated other components according to the needs in addition to the foregoing components (A) to (E).

<Silicon Compound Other than Components (A), (B), and (C)>

The inventive organic modified silicone resin composition can be formulated a silicon compound having a SiH group other than the components (A), (B), and (C); a silicon compound having an addition reactive carbon-carbon double bond other than the components (A), (B), and (C); or a combination thereof according to the needs.

<Antioxidant>

The inventive organic modified silicone resin composition can be formulated an antioxidant according to the needs. An addition of an antioxidant enables to prevent deterioration of the resin beforehand.

As the antioxidant, previously known ones can be used. Illustrative examples thereof include 2,6-di-t-butyl-4-methylphenol, 2,5-di-t-amylhydroquinone, 2,5-di-t-butylhydroquinone, 4'-butylideneibis(3-methyl-6-t-butylphenol), 2,z. r -methylenebis(4-methyl-6-t-butylphenol), and 2,2'-methylenebis(4-ethyl-6-t-butylphenol). These may be used alone or in combination of two or more kinds.

When using the antioxidant, the formulation amount can be an effective amount as an antioxidant, and is not particularly limited. However, the formulation amount is preferably about 10 to 10,000 ppm in general, particularly 100 to 1,000 ppm relative to the total mass of components (A), (B), and (C). Such formulation amount enables to exhibit a sufficient antioxidant ability to obtain a cured product with excellent strength and adhesion property without occurring deterioration of the resin.

<Light Stabilizer>

Furthermore, it is possible to use a light stabilizer in order to add resistance to photo-deterioration. As this light stabilizer, a hindered amine based light stabilizer, which captures radicals generated by photo-oxidative deterioration, is suitable. The antioxidant effect is more improved by using it together with the foregoing antioxidant.

Illustrative examples of the light stabilizer include bis(2,2,6,6-tetramethyl-4-piperidyl)sebacate, 4-benzoyl-2,2,6,6-tetramethylpiperidine, etc.

<Others>

In order to ensure the pot life, an addition reaction controlling agent such as 1-ethynylcyclohexanol and 3,5-dimethyl-1-hexyne-3-ol can be formulated. It is also possible to formulate dye, pigment, a flame-retardant, and so on according to the needs.

The viscosity of the inventive organic modified silicone resin composition have to be 10 to 100 Pa·s at 25° C., and is preferably in a range of 15 to 50 Pa·s. The viscosity less than 10 Pa·s causes a risk to spread out when transferring the composition used as die bonding material. The viscosity more than 100 Pa·s causes a risk to lower the workability, causing legginess in stamping when used as die bonding material. Herein, the viscosity is a viscosity measured with a BH-type viscometer (10 rpm).

The curing conditions of the inventive organic modified silicone resin composition varies depending on its amount, and is not particularly limited. However, it is preferable to set the condition at 60 to 180° C. for 1 to 5 hours in general.

The Shore D hardness of a cured product of the inventive organic modified silicone resin composition is preferably 60 or more, and more preferably 70 to 90. Such hardness is more suitable for die bonding material.

As described above, the inventive organic modified silicone resin composition can be an organic modified silicone resin composition with good transfer performance and workability, plying a cured product with high hardness, excellent heat discoloration resistance, adhesion property, and crack resistance. Such an inventive organic modified silicone resin composition is particularly useful as die bonding material used for die bonding of LED devices, etc.

EXAMPLE

Hereinafter, the present invention will be specifically described with reference to Examples and Comparative Examples, but the present invention is not limited thereto.

Synthesis Example 1

Preparation of Component (A)

To a 5 L four-neck flask equipped with a stirrer, a condenser, a dropping funnel, and a thermometer, 1,785 g (14.88 mol) of vinylnorbornene (trade name: V0062, product of Tokyo Chemical Industry Co., Ltd.; isomers mixture of near equivalent molar amounts of 5-vinylbicyclo[2.2.1]hept-2-ene and 6-vinylbicyclo-[2.2.1]hept-2-ene) and 455 g of toluene were added and heated to 85° C. with oil bath. To this, 3.6 g of metal platinum-supporting carbon powder (the metal platinum is contained in 5% by mass) was added. Then, 1,698 p (8,75 mol) of 1,4-bis(dimethylsilyl)benzene was added dropwise over 180 minutes with stirring. After finishing the dropping, this was further stirred with heating at 110° C. for 24 hours, followed by cooling to room temperature. Then, the metal platinum-supporting carbon was removed by filtration, toluene and excess vinylnorbornene were evaporated under reduced pressure to give 3,362 g of colorless, transparent oily reaction product (the viscosity at 25° C.: 12,820 mPa·s).

The reaction product was analyzed by FT-IR, NMR, GPC, and so on to reveal that this reaction product was a mixture of compounds shown by the following formula, comprising about 41% by mol of the compound in which n' =0, about 32% by mol of the compound in which n'=1, and about 27% by mol of the compound in which n'=2. The content of addition reactive carbon-carbon double bonds (C=C) in the whole mixture was 0.36 mol/100 g.

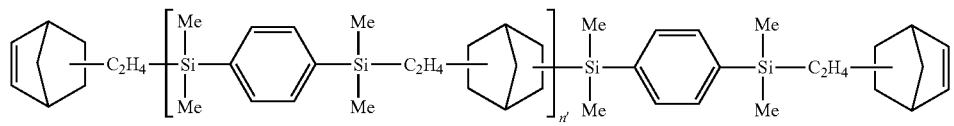

Synthesis Example 2

Preparation of Component (C)

To a 500 ml four-neck flask equipped with a stirrer, a condenser, a dropping funnel, and a thermometer, 80 g of toluene and 115.2 g (0.48 mol) of 1,3,5,7-tetramethylcyclotetrasiloxane were added and heated to 117° C. with oil bath. To this, 0.05 g of metal platinum-supporting carbon powder (the metal platinum is contained in 5% by mass) was added. Then, 48 g (0.4 mol) of vinylnorbornene (trade name: V0C62, product of Tokyo Chemical Industry Co., Ltd.; isomers mixture of nearly equivalent molar amounts of 5-vinylbicyclo-[2.2.1]hept-2-ene and 6-vinylbicyclo[2.2.1]hept-2-ene) was added dropwise over 16 minutes with stirring. After finishing the dropping, this was further stirred with heating at 125° C. for 16 hours, followed by cooling to room temperature. Then, the metal platinum-supporting carbon was removed by filtration, and toluene was evaporated under reduced pressure to give 152 g of colorless, transparent oily reaction product (the viscosity at 25° C.: 2,500 mm$^2$/s).

The reaction product was analyzed by FT-1R, NMR, GPC, and so on to reveal that this reaction product was a mixture of:

about 6% by mol of a compound having one tetramethylcyclotetrasiloxane ring (an example of the representative structural formula is shown below)

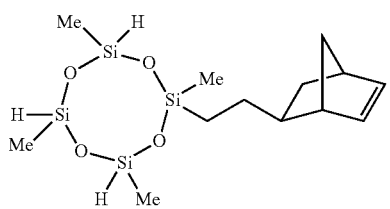 [SMILES: C[SiH]1O[SiH](C)O[Si](C)(CCC2CC3C=CC2C3)O[SiH](C)O1]

about 25% by mol of a compound having two totramethylcyclotetrasiloxane rings (an example of the representative structural formula is shown below)

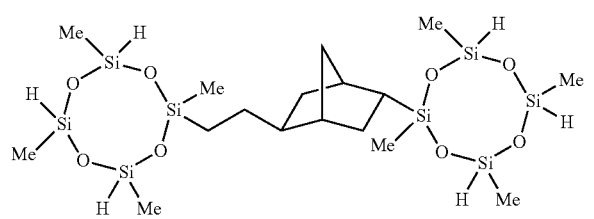 [SMILES: C[SiH]1O[SiH](C)O[Si](C)(CCC2CC3CC2CC3[Si]2(C)O[SiH](C)O[SiH](C)O[SiH](C)O2)O[SiH](C)O1]

about 16% by mol of a compound having three fetramethylcyclotetrasiloxane rings (an example of the representative structural formula is shown below)

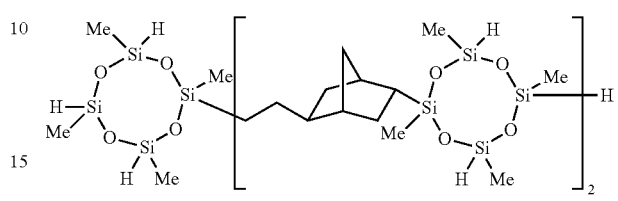

about 11% by mol of a compound having four tetramethylcyclotetrasiloxane rings (an example of the representative structural formula is shown below)

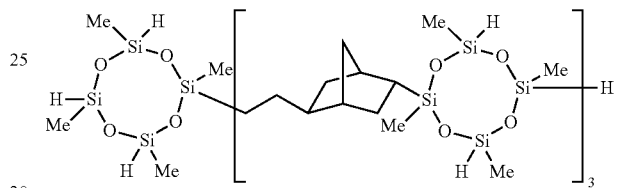

the residual of a compound having 5 to 12 tetramethylcyclotetrasiloxane rings (an example of the representative structural formula is shown below)

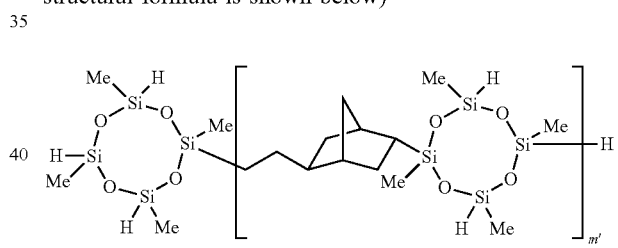

wherein m' is an integer of 4 to 11.
The content of SiH groups in the whole mixture was 0.63 mol/100 g.

Example 1

As a component (A), 56 parts by mass of the reaction product obtained in Synthesis Example 1, and as a component (E), 2.5 parts by mass of REOLOSIL DM-30 were homogeneously mixed by using planetary mixer, and then as a component (C), 36 parts by mass of the reaction product obtained in Synthesis Example 2, as a component (B), 8 parts by mass of 1-(2-trimethoxysilylethyl)-3-(3-glycidoxypropyl)-1,3,5,7-tetramethylcyclotetrasiloxane, and 0.03 parts by mass of 1-ethynylcyclohexanol were homogeneously mixed. In this mixture, the molar ratio of SiH/C=C was 1.28.

Furthermore, as a component (D), platinum-vinylsiloxane complex: in the amount of 20 ppm in terms of the platinum metal atom relative to the total mass of the mixture was homogeneously mixed to give a composition.

Example 2

As a component (A), 59 parts by mass of the reaction product obtained in Synthesis Example 1, and
as a component (E), 5.0 parts by mass of REOLOSIL DM-30 were homogeneously mixed by using planetary mixer, and then
as a component (C), 33 parts by mass of $HMe_2SiO(MeHSiO)_2(Ph_2SiO)_2SiMe_2H$,
as a component (B), 8 parts by mass of 1-(2-trimethoxysilylethyl)-3-(3-glycidoxypropyl)-1,3,5,7-tetramethylcyclotetrasiloxane, and 0.03 parts by mass of 1-ethynylcyclohexanol were homogeneously mixed. In this mixture, the molar ratio of SiH/C=C was 1.11.
Furthermore, as a component (D), platinum-vinylsiloxane complex: in the amount of 20 ppm in terms of the platinum metal atom relative to the total mass of the mixture was homogeneously mixed to give a composition.

Example 3

As a component (A), 76 parts by mass of the reaction product obtained in Synthesis Example 1, and
as a component (E), 7.0 parts by mass of REOLOSIL DM-30 were homogeneously mixed by using planetary mixer, and then
as a component (C), 16 parts by mass of $(MeHSiO)_4$,
as a component (B), 8 parts by mass of 1-(2-trimethoxysilylethyl)-3-(3-glycidoxypropyl)-1,3,5,7-tetramethylcyclotetrasiloxane, and 0.03 parts by mass of 1-ethynylcyclohexanol were homogeneously mixed. In this mixture, the molar ratio of SiH/C=C was 1.09.
Furthermore, as a component (D), platinum-vinylsiloxane complex: in the amount of 20 ppm in terms of the platinum metal atom relative to the total mass of the mixture was homogeneously mixed to give a composition.

Example 4

The same preparation as in Example 1 was carried out except that the formulation amount of REOLOSIL DM-30 used as a component (E) was set to 1.0 parts by mass to give a composition.

Example 5

The same preparation as in Example 1 was carried out except that the formulation amount of REOLOSIL DM-30 used as a component (E) was set to 10.0 parts by mass to give a composition.

Comparative Example 1

The same preparation as in Example 1 was carried out except that the formulation amount of REOLOSIL DM-30 used as a component (E) was set to 0.5 parts by mass to give a composition.

Comparative Example 2

The same preparation as in Example 7 was carried out except that the formulation amount of REOLOSIL DM-30 used as a component (E) was set to 11.0 parts by mass to give a composition.

Comparative Example 3

Methylsilicone-based die bonding material KER-3000-M2 produced by Shin-Etst Chemical Co., Ltd. was evaluated.
The formulation amounts of each component in the foregoing Examples and Comparative examples are summarized in the following Table 1.
In Table 1, "parts" represents "parts by mass."

TABLE 1

| | Components | Example 1 | Example 2 | Example 3 | Example 4 | Example 5 | Comparative Example 1 | Comparative Example 2 | Comparative Example 3 |
|---|---|---|---|---|---|---|---|---|---|
| (A) | Reaction product obtained in Synthesis Example 1 | 56 parts | 59 parts | 76 parts | 56 parts | 56 parts | 56 parts | 56 parts | Methyl-silicone |
| (B) | 1-(2-trimethoxy-silylethyl)-3-(3-glycidoxypropyl)-1,3,5,7-tetramethyl-cyclotetrasiloxane | 8 parts | 8 parts | 8 parts | 8 parts | 8 parts | 8 parts | 8 parts | |
| (C) | Reaction product obtained in Synthesis Example 2 | 36 parts | — | — | 36 parts | 36 parts | 36 parts | 36 parts | |
| | $HMe_2SiO(MeHSiO)_2(Ph_2SiO)_2SiMe_2H$ | — | 33 parts | — | — | — | — | — | |
| | $(MeHSiO)_4$ | — | — | 16 parts | — | — | — | — | |
| (D) | Platinum-vinyl-siloxane complex | 20 ppm | 20 ppm | 20 ppm | 20 ppm | 20 ppm | 20 ppm | 20 ppm | |
| (E) | REOLOSIL DM-30 | 2.5 parts | 5.0 parts | 7.0 parts | 1.0 parts | 10.0 parts | 0.5 parts | 11.0 parts | |
| Other | 1-ethynyl-cyclohexanol | 0.03 parts | 0.03 parts | 0.03 parts | 0.03 parts | 0.03 parts | 0.03 parts | 0.03 parts | |
| | SiH/C=C | 1.28 | 1.11 | 1.09 | 1.28 | 1.28 | 1.28 | 1.28 | |

<Performance Evaluation Method>
On each composition prepared as described above, the following tests were carried out.
The results of the tests are shown in Table 2.
(Viscosity of Composition)
The viscosities at 25° C. were measured by using a BH-type viscometer (rotor No. 6, 10 rpm or 20 rpm). Each thixotropy index (the viscosity at 10 rpm/ the viscosity at 20 rpm) was determined by measured viscosities.
(Hardness of Cured Product)
The compositions obtained in Examples and Comparative Examples were heated at 150° C. for 3 hours. On each obtained cured product, Shore D hardness was measured.

(Transfer Performance)

The workability was evaluated when each composition was transferred in the constant amount onto a silver-plated electrode part of an SMD5050 package (product of I-CHIUN PRECISION INDUSTRY Co., Ltd., resin: PPA) by stamping with die bonder (product of ASM Pacific Technology Ltd., AD-830), and air opto-semiconductor device (0.4×0.24 mm) was mounted thereon.

(Adhesion)

The packages prepared in evaluation tests for transfer performances were pat into an oven and heated at 150° C. for 3 hours to cure the compositions. The die shear strengths were measured with a bond tester (product of Dage Japan Co., Ltd.; Series4000).

(Heat Discoloration Resistance Test)

By using compositions obtained in Examples and Comparative Examples, each cured sample with a size of 40×20×2 mm was prepared through heat curing at 150° C. for 3 hours. The changes of the appearances after treated at 120° C. for 2,000 hours were observed.

TABLE 2

|  | Example 1 | Example 2 | Example 3 | Example 4 | Example 5 | Comparative Example 1 | Comparative Example 2 | Comparative Example 3 |
|---|---|---|---|---|---|---|---|---|
| Viscosity 10 rpm (Pa·s) | 16.2 | 30.0 | 45.0 | 10.1 | 95.0 | 5.0 | 120 | 40 |
| Viscosity 20 rpm (Pa·s) | 12.2 | 21.4 | 31.3 | 8.1 | 56.0 | 4.5 | 82.2 | 30.3 |
| Thixotropy index (10 rpm/20 rpm) | 1.33 | 1.40 | 1.44 | 1.25 | 1.70 | 1.11 | 1.45 | 1.32 |
| Hardness (Shore D) | 83 | 72 | 78 | 82 | 84 | 78 | 85 | 56 |
| Transfer performance | good | good | good | good | good | Spread in transfer | Legginess in stamping | good |
| Adhesion (MPa) | 28.2 | 25.0 | 27.2 | 28.0 | 29.0 | 20.0 | 29.1 | 19.0 |
| Heat discoloration resistance test (120° C. × 2,000 hours) | No discoloration | No discoloration | No discoloration | No discoloration | No discoloration | No discoloration | No discoloration | No discoloration |

As shown in Table 1, each of Examples 1 to 5, in which fumed inorganic oxide of the component (E) was contained in an amount of 1 to 10 parts by mass relative to 100 parts by mass of the total amount of the components (A), (B), and (C), gave a composition with a proper viscosity having a thixotropic property, thereby showing good transfer property. They also showed superior adhesion properties than in Comparative Example 3, which used methylsilicone-based die bonding material. Moreover, they showed excellent heat discoloration resistances equivalent to that of Comparative Example 3.

On the other hand, in Comparative Example 1, in which the formulation amount of the component (E) was less than 1 part by mass, the die bonding material was spread out over the substrate in the transfer, and was inferior in minute transfer property. In Comparative Example 2, in which the formulation amount of the component (E) was more than 10 parts by mass, the high viscosity caused legginess in stamping and dispersion of the die bonding material near the transfer part, thereby showing inferior workability. The methylsilicone-based die bonding material in Comparative Example 3 showed superior workability, but the adhesion property and hardness were inferior to those of Examples.

As described above, it has revealed that the inventive organic modified silicone resin composition. can be an organic modified silicone resin, composition with good transfer performance and workability, giving a cured product, with high hardness, excellent heat discoloration resistance, adhesion property, and crack resistance.

It is to he noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. An organic modified silicone resin composition comprising:
    (A) an addition reaction product having two addition reactive carbon-carbon double bonds in one molecule, being a product of an addition reaction of
        (a) a compound shown by the following general formula (1), having two silicon atom-bonded hydrogen atoms in one molecule,

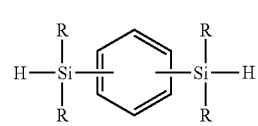

(1)

wherein "R" independently represents an alkoxy group having 1 to 6 carbon atoms or a monovalent hydrocarbon group having 1 to 12 carbon atoms being unsubstituted or substituted with any of a halogen atom, a cyano group, or a glycidoxy group, and
        (b) a polycyclic hydrocarbon having two addition reactive carbon-carbon double bonds in one molecule;
    (B) a siloxane having a silicon atom-bonded hydrogen atom and an organic group substituted with an alkoxysilyl group, a siloxane having a silicon atom-bonded hydrogen atom and an organic group substituted with an epoxy group, or a combination thereof;
    (C) a compound having three or more silicon atom-bonded hydrogen atoms in one molecule other than the component (B);
    (D) a hydrosilylation reaction catalyst; and
    (E) fumed silica;
    wherein the formulation amount of the component (E) is 1 to 10 parts by mass relative to 100 parts by mass of the total amount of the components (A), (B), and (C); and
    having a viscosity of 15 to 50 Pa·s at 25° C., measured with a BH-type viscometer (10 rpm).

2. The organic modified silicone resin composition according to claim 1, wherein the (b) polycyclic hydrocarbon is either or both of 5-vinylbicyclo [2.2.1]hept-2-ene and 6-vinylbicyclo[2.2.1]hept-2-ene.

3. The organic modified silicone resin composition according to claim 2, wherein the Shore D hardness of a cured product of the organic modified silicone resin composition is 60 or more.

4. The organic modified silicone resin composition according to claim 2, wherein the component (C) is a compound having a cyclic siloxane structure.

5. The organic modified silicone resin composition according to claim 4, wherein the component (C) is an addition reaction product of 1,3,5,7-tetramethylcyclotetrasiloxane and either or both of 5-vinylbicyclo[2.2.1]hept-2-ene and 6-vinylbicyclo [2.2.1]hept-2-ene.

6. The organic modified silicone resin composition according to claim 1, wherein the component (C) is a compound having a cyclic siloxane structure.

7. The organic modified silicone resin composition according to claim 6, wherein the Shore D hardness of a cured product of the organic modified silicone resin composition is 60 or more.

8. The organic modified silicone resin composition according to claim 6, wherein the component (C) is an addition reaction product of 1,3,5,7-tetramethylcyclotetrasiloxane and either or both of 5-vinylbicyclo[2.2.1]hept-2-ene and 6-vinylbicyclo [2.2.1]hept-2-ene.

9. The organic modified silicone resin composition according to claim 8, wherein the Shore D hardness of a cured product of the organic modified silicone resin composition is 60 or more.

10. The organic modified silicone resin composition according to claim 1, wherein the Shore D hardness of a cured product of the organic modified silicone resin composition is 60 or more.

11. The organic modified silicone resin composition according to claim 1, wherein the amount of component (E) is 2 to 8 parts by mass relative to 100 parts by mass of the total amount of the components (A), (B), and (C).

* * * * *